United States Patent [19]
Sgrignoli

[11] Patent Number: 5,675,283
[45] Date of Patent: Oct. 7, 1997

[54] PILOT RECOVERY AND POLARITY DETECTION SYSTEM

[75] Inventor: Gary J. Sgrignoli, Mt. Prospect, Ill.

[73] Assignee: Zenith Electronics Corporation, Glenview, Ill.

[21] Appl. No.: 691,656

[22] Filed: Aug. 2, 1996

[51] Int. Cl.[6] ............................................. H03D 1/00
[52] U.S. Cl. ..................... 329/357; 329/360; 375/317; 375/321; 455/204; 455/214
[58] Field of Search ................................. 329/349, 357, 329/360; 331/23, DIG. 2; 375/317, 321; 455/204, 214, 312, 337

[56] References Cited

U.S. PATENT DOCUMENTS 3,849,730  11/1974  Ho ........................................ 329/360 X

Primary Examiner—David Mis

[57] ABSTRACT

A polarity detection circuit for an FPLL demodulated signal including a small DC pilot recovers the DC pilot by determining the DC levels of the demodulated output signals both with and without the DC pilot. A zero carrier condition is created for determining the DC level of the output signal without the DC pilot. The two DC levels are subtracted and limited and the polarity of the recovered DC pilot is used to control the operation of a polarity inverter to assure that the output signal has a desired polarity.

20 Claims, 1 Drawing Sheet

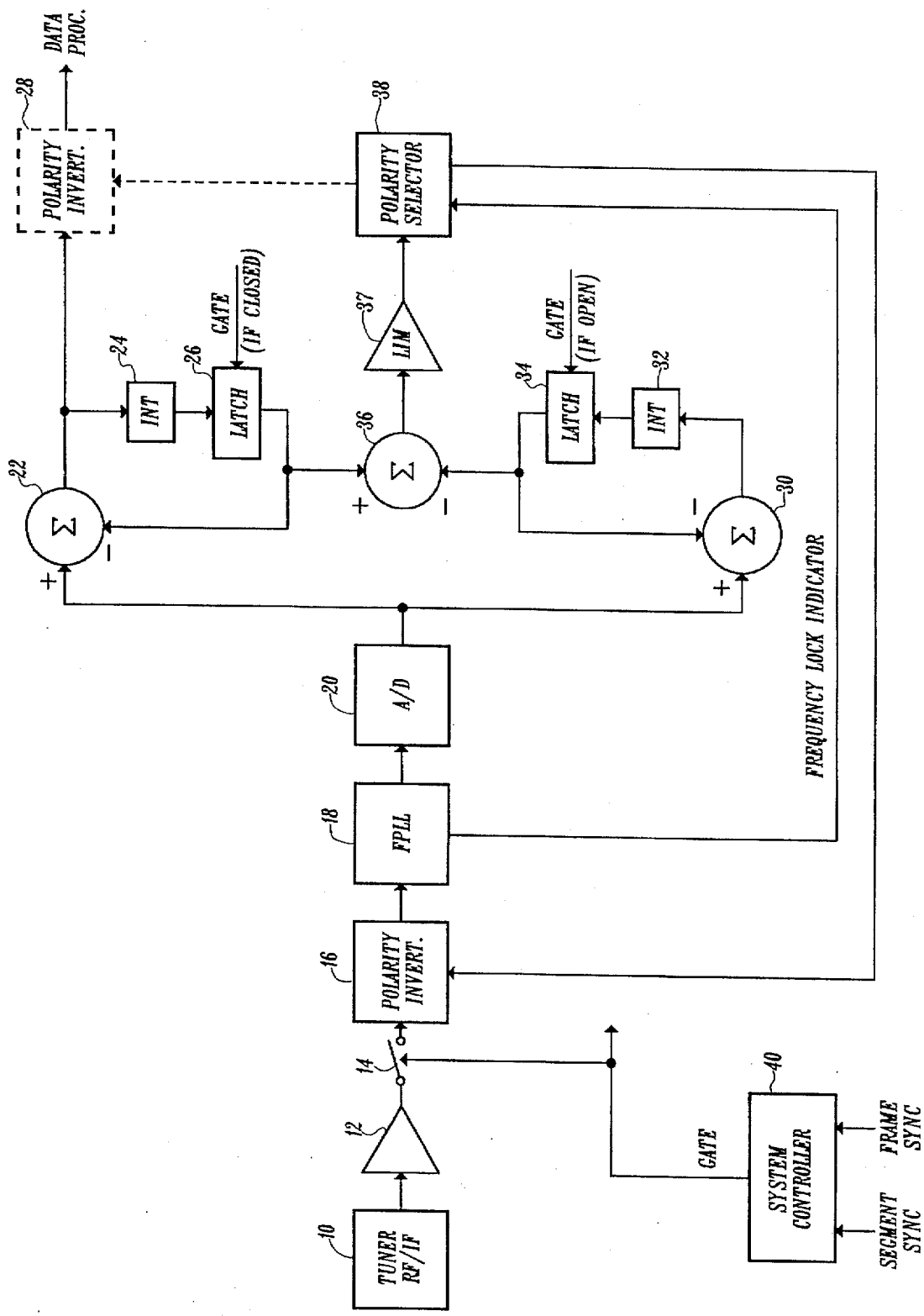

PILOT RECOVERY AND POLARITY DETECTION SYSTEM

CROSS REFERENCE TO RELATED APPLICATION

This invention includes apparatus disclosed in application Ser. No. 691,480 of the inventor, entitled DC OFFSET COMPENSATION METHOD AND APPARATUS.

BACKGROUND OF THE INVENTION AND PRIOR ART

This invention relates generally to vestigial sideband (VSB) signal data systems including an in-phase pilot in the form of a small baseband DC offset and particularly to pilot recovery and its use in a polarity detection arrangement.

The above-described copending patent application discloses a technique for determining the DC level of the FPLL (frequency and phase locked loop) demodulator output in order to compensate the output signal for circuit DC offsets. The technique involves using an RF switch to momentarily establish a zero carrier condition for the FPLL which corresponds to no signal and no pilot. Any DC that is present in the demodulated output signal during the zero carrier time is solely due to DC offsets in the baseband signal processing circuitry and is eliminated from the output signal.

The demodulated VSB digital data signal is bipolar, that is, it travels above and below a zero level by an almost equal amount, the difference being due to the DC-shifted value of the pilot. The small DC produced by demodulation of the pilot is very important in carrier recovery and in determining the lock up polarity of the bistable FPLL demodulator. The FPLL is preferably used in the VSB receiver due to its desirable frequency and phase locking characteristics.

Since the demodulated DC pilot is small, DC circuit offsets can easily interfere with its recovery. In particular, the polarity of the pilot indicates the polarity of the demodulated output signal and may be used for determining the proper lock up phase for the FPLL. It can readily be seen that a large DC offset may completely override the pilot and render it useless for polarity detection purposes.

The present invention provides for recovery of the pilot and accurate determination of its polarity which enables reliable control of the polarity of the output signal from the FPLL demodulator.

OBJECTS OF THE INVENTION

A principal object of the invention is to provide a novel method and apparatus for recovering a DC pilot in an FPLL demodulator output signal.

Another object of the invention is to provide a polarity detection method and apparatus for an FPLL demodulated output signal including a small DC pilot.

A further object of the invention is to provide an improved VSB receiver having a bistable FPLL demodulator.

BRIEF DESCRIPTION OF THE DRAWING

These and other objects and advantages of the invention will be apparent upon reading the following description thereof in conjunction with the drawing, the single Figure of which is a simplified diagram of the inventive apparatus.

DESCRIPTION OF THE PREFERRED EMBODIMENT

A tuner RF/IF circuit 10 receives a VSB signal having a small in-phase pilot and supplies it to a buffer amplifier 12 that in turn is coupled to an RF/IF switch 14. Switch 14 is shown as a mechanical device for illustrative purposes only, it being understood that an electronic arrangement is contemplated. Switch 14 is coupled to a polarity inverter 16 that in turn is coupled to an FPLL demodulator 18. The demodulated data output signal from FPLL 18 is supplied to an analog-to-digital (A/D) converter 20, where it is converted to digital form.

A/D 20 supplies an adder 22 that supplies the output signal to an integrator 24 and to a polarity inverter 28, indicated in dotted lines. It will be understood that only one of polarity inverters 16 and 28 is used in a circuit arrangement, the dotted line version representing an alternative placement for the polarity inverter. The integrator 24 receives the output signal and supplies it to a latch 26, the output of which supplies the negative input of adder 22 and the positive input of an adder 36.

A/D 20 also supplies another adder 30 that in turn supplies an integrator 32. Integrator 32 supplies a latch 34 that in turn is coupled to the negative input of adder 30 and to the negative input of adder 36. The output of adder 36 supplies a limiter 37, that in turn supplies a polarity selector 38. Polarity selector 38 operates whichever one of the polarity inverters 16 and 28 that is used. Polarity selector 38 is controlled by a frequency lock indicator signal from FPLL 18, which signal is generated when the FPLL has attained frequency lock or is within its one-half cycle pull-in range of frequency lock. Switch 14 and the latches 26 and 34 are controlled by gate signals from a system controller 40 that is operated periodically to establish a zero carrier condition, i.e. one in which the RF/IF signal is not supplied to FPLL 18. System controller 40 is supplied with the segment sync and frame sync signals that are derived by well known means, not shown. In particular, latch 26 is enabled when the gate signal corresponds to the switch 14 being closed and latch 34 is enabled when the gate signal corresponds to switch 14 being open. The gate signal may be generated frequently or only rarely, as needed.

When the switch 14 is closed (normal operation of the circuit), integrator 24 averages the random data and measures all of the DC in the output signal, including that due to the demodulated DC pilot. This value is latched in latch 26 and subtracted from the output signal in adder 22. Thus the DC in the output signal is removed, which is desirable. When the switch 14 is open, there can be no DC pilot and integrator 34 determines the DC level of the output signal which, in this instance, is solely due to baseband circuit DC offsets. Adder 36 effectively subtracts the two DC levels from each other, and in so doing, precisely recovers the DC pilot. In particular, the output of limiter 37 reflects the polarity of the recovered DC pilot. As those skilled in the art know, the polarity of the DC pilot is the same as that of the demodulated output signal and consequently the demodulated pilot may be used to assure that the demodulated output signal has a certain polarity. Since the desired polarity for the circuitry is known, polarity selector 38 is set up to change the polarity of the output signal if the output of limiter 37 indicates that the polarity of the recovered DC pilot is incorrect. Polarity selector 38 accomplishes this by operating either polarity inverter 16 to invert the RF/IF signal polarity or by operating polarity inverter 28 to directly invert the polarity of the demodulated data output signal.

Those skilled in the art will appreciate that the two integrators 24 and 32 may be replaced by a single multiplexed integrator to reduce costs. Also, other techniques may be used for determining the DC levels of the signals under normal and zero carrier conditions and that the DC recovery may be accomplished on the analog portions of the signal rather than on the digital portions of the signal as illustrated. It is recognized that other changes in the described embodiment of the invention will occur to those skilled in the art without departing from its true spirit and scope. The invention is to be limited only as defined in the claims.

What is claimed is:

1. A method of processing an FPLL demodulated signal including a DC pilot comprising:
   determining the DC level of the FPLL demodulated output signal with the pilot;
   determining the DC level of the FPLL demodulated output signal without the pilot; and
   subtracting the two determined DC levels to recover the pilot.

2. The method of claim 1, further comprising:
   establishing a zero carrier condition for determining the DC level of the FPLL demodulated output signal without the pilot.

3. The method of claim 2, wherein the determining steps are performed by integrating the FPLL demodulated output signal.

4. The method of claim 3, further comprising:
   controlling the polarity of the FPLL demodulated output signal based upon the polarity of the recovered pilot.

5. A method of processing an FPLL demodulated signal including a DC pilot comprising:
   integrating the FPLL demodulated output signal to determine its DC level with the DC pilot;
   integrating the FPLL demodulated output signal under a zero carrier condition to determine its DC level without the DC pilot; and
   subtracting the two determined DC levels to recover the magnitude and the polarity of the DC pilot.

6. The method of claim 5, further comprising:
   controlling the polarity of the FPLL demodulated output signal based upon the polarity of the recovered DC pilot.

7. The method of claim 5, further comprising:
   developing a polarity control signal based upon the polarity of the DC pilot; and
   controlling a polarity inverter with the control signal.

8. A method of detecting the polarity of lock in an FPLL demodulated signal including a DC pilot comprising:
   A/D converting the demodulated signal;
   determining the DC level of the FPLL demodulated output signal with the DC pilot;
   determining the DC level of the FPLL demodulated output signal without the DC pilot; and
   subtracting the two determined DC levels to find the polarity of the DC pilot.

9. The method of claim 8, further including:
   developing a polarity control signal based upon the polarity of the DC pilot; and
   producing a change in the polarity of the FPLL demodulated output signal, if required, with the control signal.

10. The method of claim 9, further comprising:
    establishing a zero carrier condition for determining the DC level of the FPLL demodulated output signal without the DC pilot.

11. The method of claim 10, wherein the determining steps are performed by integrating the FPLL demodulated output signal.

12. A method of providing a given polarity FPLL demodulated output signal that includes a DC pilot comprising:
    A/D converting the output signal;
    integrating the output signal under a zero carrier condition to determine its DC level without the DC pilot;
    integrating the output signal to determine its DC level with the DC pilot;
    subtracting the determined DC levels to find the polarity of the DC pilot; and
    producing a change in the polarity of the demodulated output signal, if required, based upon the polarity of the DC pilot.

13. A receiver for receiving a signal including a pilot in the form of a DC offset comprising:
    FPLL demodulator means for producing a demodulated output signal with a DC pilot;
    means for determining the DC levels of said output signal with said DC pilot and without said DC pilot; and
    means for subtracting said two determined DC levels to recover said DC pilot.

14. The receiver of claim 13, further including:
    means for establishing a zero carrier condition for said FPLL demodulator means; and
    wherein said determining means determines said DC level of said output signal without said DC pilot under said zero carrier condition.

15. The receiver of claim 14, wherein said determining means includes integrator means and wherein said establishing means includes gate means for controlling said integrator means.

16. The receiver of claim 15, further including:
    polarity selection means for changing the polarity of said output signal; and
    said polarity selection means responsive to said recovered DC pilot for assuring a given polarity of said output signal.

17. A receiver for receiving an RF signal including a pilot in the form of a DC offset comprising:
    FPLL demodulator means for producing an output signal including a DC pilot from said RF signal;
    A/D converter means for converting said output signal to digital form;
    polarity inverting means for changing the polarity of said output signal;
    integrator means for determining a first DC level of said output signal including said DC pilot and a second DC level of said output signal excluding said DC pilot;
    gate means for establishing a zero RF carrier condition and for operating said integrator means to determine said first and second DC levels;
    means for determining the polarity of said DC pilot by subtracting said first and second DC levels; and
    polarity selection means for operating said polarity inverting means, as required, to assure a given polarity of said output signal in response to the polarity of said DC pilot.

18. The receiver of claim 17, further including:
    latch means coupled to said integrator means; and
    means coupled to said A/D converter means and to said latch means for removing said first DC level from said output signal.

19. The receiver of claim 17, further including:
    frequency lock means for determining when said FPLL demodulator means has substantially attained frequency lock; and
    said polarity selector means being enabled by said frequency lock means.

20. The receiver of claim 19, wherein said gate means comprise switch means for establishing said zero carrier condition.

* * * * *